United States Patent [19]
Blalock et al.

[11] Patent Number: 5,438,011
[45] Date of Patent: Aug. 1, 1995

[54] METHOD OF FORMING A CAPACITOR USING A PHOTORESIST CONTACT SIDEWALL HAVING STANDING WAVE RIPPLES

[75] Inventors: Guy T. Blalock; Bradley J. Howard, both of Boise, Id.

[73] Assignee: Micron Technology, Inc., Boise, Id.

[21] Appl. No.: 397,885

[22] Filed: Mar. 3, 1995

[51] Int. Cl.$^6$ .................. H01L 21/70; H01L 27/00
[52] U.S. Cl. ........................ 437/52; 437/60; 437/919
[58] Field of Search ............... 437/52, 60, 919, 47

[56] References Cited

U.S. PATENT DOCUMENTS

| | | | |
|---|---|---|---|
| 4,855,802 | 8/1989 | Kuesters. | |
| 5,010,039 | 4/1991 | Ku et al. | 437/228 |
| 5,045,899 | 9/1991 | Arimoto | 357/23.6 |
| 5,084,405 | 1/1992 | Fazan et al. | 427/52 |
| 5,150,276 | 4/1992 | Gonzalez et al. | 361/313 |
| 5,185,282 | 2/1993 | Lee et al. | 437/47 |
| 5,218,219 | 6/1993 | Ajika et al. | 257/309 |
| 5,238,862 | 8/1993 | Blalock et al. | 437/52 |
| 5,340,765 | 8/1994 | Dennison et al. | 437/52 |
| 5,354,705 | 10/1994 | Mathews et al. | 437/52 |

FOREIGN PATENT DOCUMENTS

| | | |
|---|---|---|
| 63-133565 | 6/1988 | Japan. |
| 1-100960 | 4/1989 | Japan. |
| 1-215060 | 8/1989 | Japan. |

OTHER PUBLICATIONS

Ozaki et al., "A Fence Stacked Capacitor (FSC) Cell For 256 MBit DRAMS", ULSI Research Center, Toshiba Center, Date Unknown.
Ahn, J. H., et al., "Micro Villus Patterning (MVP) Technology for 256 Mb DRAM Stack Cell", 1992 Symposium on VLSI Technology digest of Technical Papers, pp. 12–13.
Wakamiya, et al., "Novel Stack Capacitor Cell For 6 Mb DRAM, LSI R&D Laboratory", Mitsubishi Electronic Corp., pp. 69–70, Date Unknown.
IBM Technical Disclosure Bulletin, "Stacked Capacitor DRAM Cell With Vertical Fins (VF-STC)", vol. 33, No. 2, Jul. 1990, pp. 245–246.
K. H. Kusters, et al., "A Stacked Capacitor Cell With A Fully Self-Aligned Contact Process For High-Density Dynamic Random Access Memories", J. Electrochem.

(List continued on next page.)

*Primary Examiner*—Olik Chaudhuri
*Assistant Examiner*—H. Jey Tsai
*Attorney, Agent, or Firm*—Wells, St. John, Roberts, Gregory & Matkin

[57] ABSTRACT

A method of forming a stacked container capacitor includes, a) providing a substrate having a node to which electrical connection to a capacitor is to be made; b) then, providing a layer of photoresist; c) patterning the photoresist to form a photoresist contact which overlaps within lateral confines of the node, and in a manner which produces inner photoresist contact sidewalls having standing wave ripples; d) providing a layer of sacrificial material over the photoresist and within the photoresist contact, the sacrificial layer having a thickness which less than completely fills the photoresist contact, the standing wave ripples first transferring to those regions of the sacrificial layer which overlap the photoresist contact inner sidewall standing wave ripples; e) anisotropically etching the sacrificial material to produce a male molding ring having outer sidewalls possessing the first transferred standing wave ripples; f) stripping the photoresist; g) providing a layer of electrically conductive material over and within the male molding ring, the first transferred standing wave ripples second transferring to those regions of the conductive layer which overlap the first transferred standing wave ripples; h) anisotropically etching the conductive layer to outwardly expose upper portions of the male molding ring and produce a capacitor container ring having inner sidewalls possessing the second transferred standing wave ripples, the capacitor container ring electrically contacting the node; i) stripping the male molding ring from the substrate; and j) providing a capacitor dielectric layer and outer capacitor plate over the capacitor container rippled inner sidewalls.

25 Claims, 7 Drawing Sheets

OTHER PUBLICATIONS

Soc., vol. 139, No. 8, Aug. 1992, pp. 2318–2320.

Itoh, et al., "Two Step Deposited Rugged Surface (TDRS) Storagenode and Self Aligned Bitline-Contact Pentrating Cellplate (SABPCE) for 64 MbDRAM STC Cell", Oki Electrica industry Co., Date Unknown.

Kaga et al., "Crown-Shaped Stacked-Capacitor Cell for 1.5-V Operation 64-Mb DRAMs", Feb. 1991.

Hayashide, et al., "Fabrication of Storage Capacitance-Enhanced Capacitors With A Rough Electrode", Extended Abstracts of the 22nd Conference on Solid State Devices and Materials Sendai, 1990, pp. 869–872.

Inoue, et al., "A Spread Stacked Capacitor (SSC) Cell For 64 Mbit DRAMs", IEEE 1989, pp. 31–34.

Ema, et al., "3-Dimensional Stacked Capacitor Cell for 16 M and 64 M DRAMs", IEEE 1988, pp. 592–595.

Kawamoto et al., "A 1.28 $\mu m^2$ Bit-Line Shielded Memory Cell Technology for 64 Mb DRAMs", Symposium on VLSI Technology 1990, pp. 13–14.

Temmler, D., "Multilayer Vertical Stacked Capacitors (MVSTC) For 64 Mbit and 256 Mbit DRAMs", Institute of Semiconductor Physics, pp. 13–14, date unknown.

Inoue, et al., A Spread Stacked Capacitor

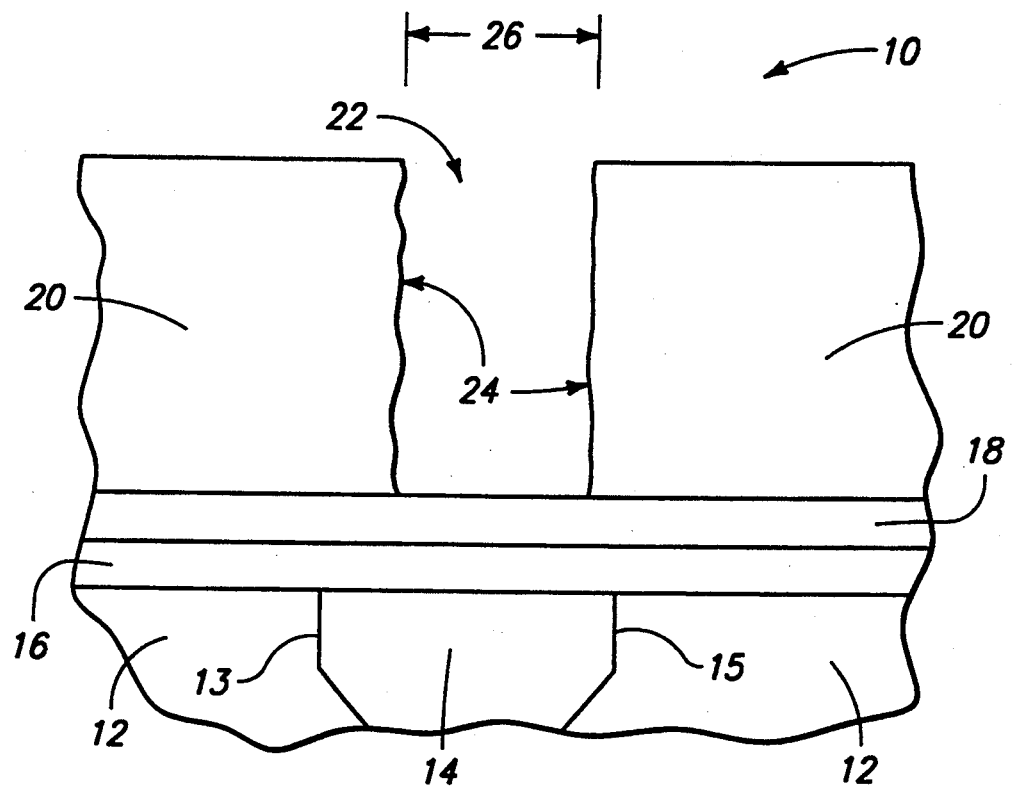
$\mathbb{FIG}\ 1$
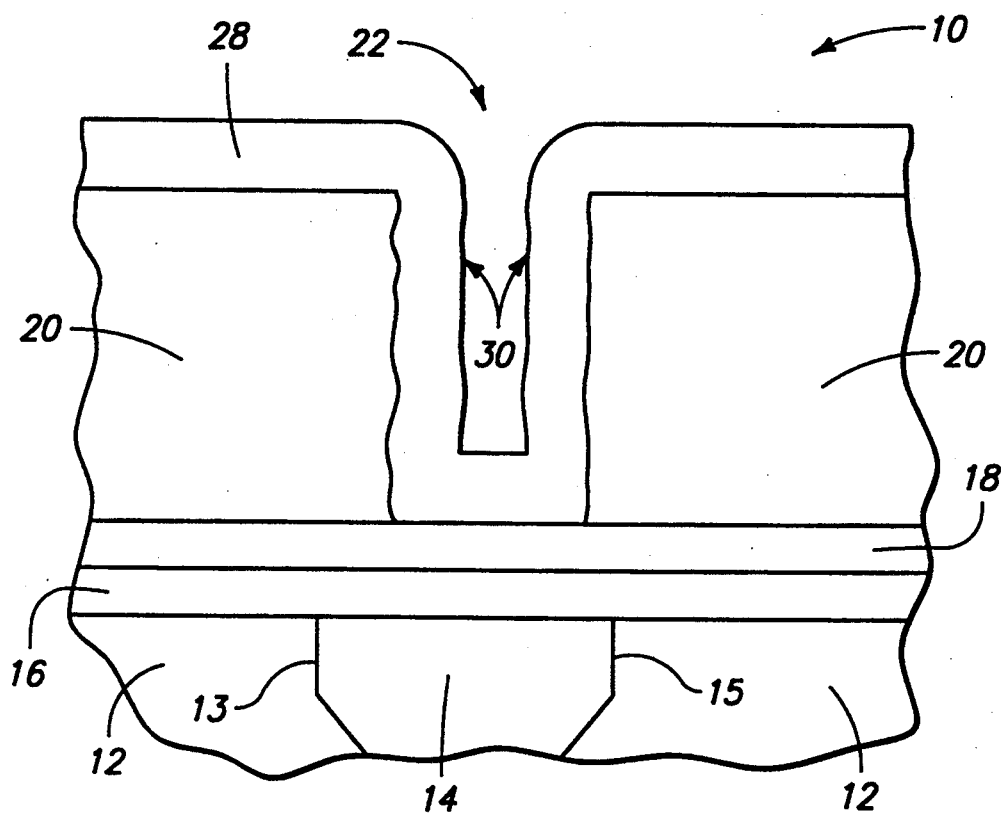
$\mathbb{FIG}\ 2$

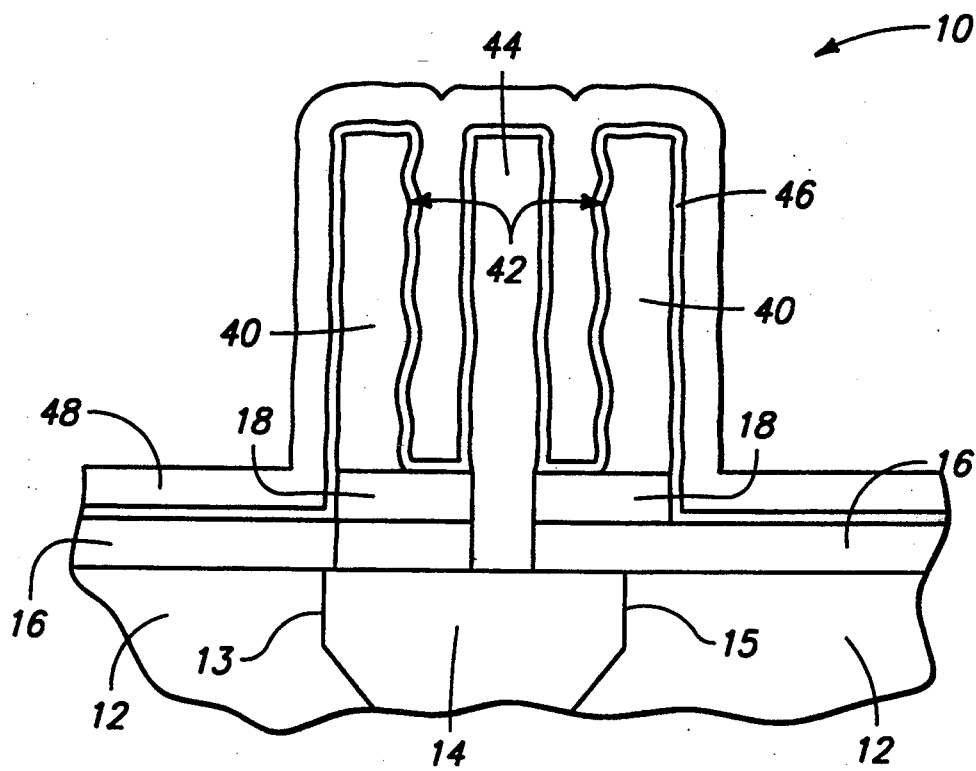
_Fig. 11_
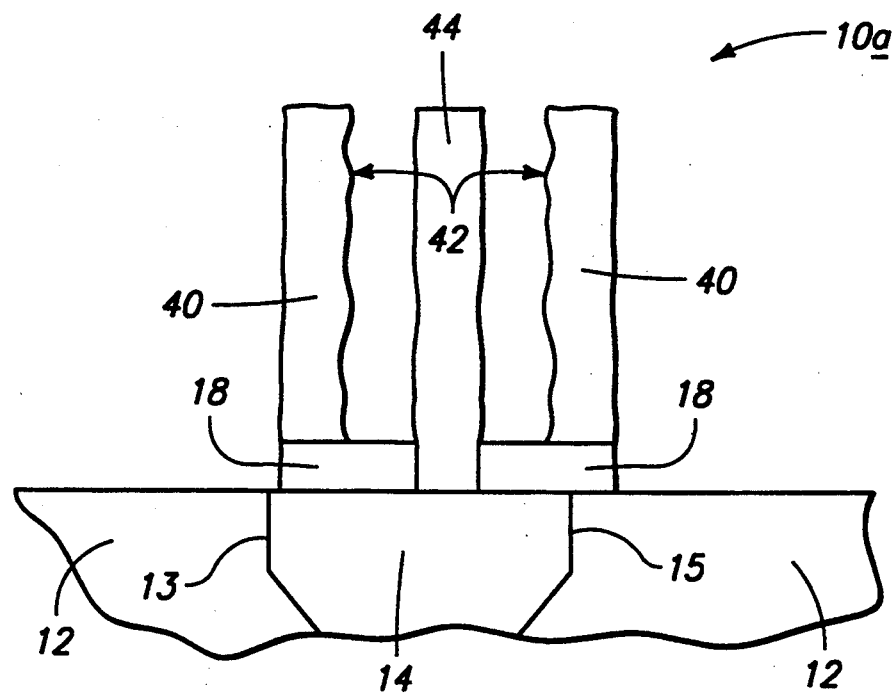
_Fig. 12_

5,438,011

METHOD OF FORMING A CAPACITOR USING A PHOTORESIST CONTACT SIDEWALL HAVING STANDING WAVE RIPPLES

TECHNICAL FIELD

This invention relates generally to capacitor formation in semiconductor wafer processing, and to formation of memory cells employing capacitors.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors.

BRIEF DESCRIPTION OF THE DRAWINGS

Preferred embodiments of the invention are described below with reference to the following accompanying drawings.

FIG. 1 is a diagrammatic fragmentary sectional view of a semiconductor wafer fragment at one processing step in accordance with the invention.

FIG. 2 is a view of the FIG. 1 wafer taken at a processing step subsequent to that shown by FIG. 1.

FIG. 11 is a view of the FIG. 1 wafer taken at a processing step subsequent to that shown by FIG. 9.

FIG. 12 is a diagrammatic fragmentary sectional view of an alternate embodiment semiconductor wafer fragment at an alternate processing step in accordance with the invention.

DETAILED DESCRIPTION OF THE PREFERRED EMBODIMENTS

Figure 3:
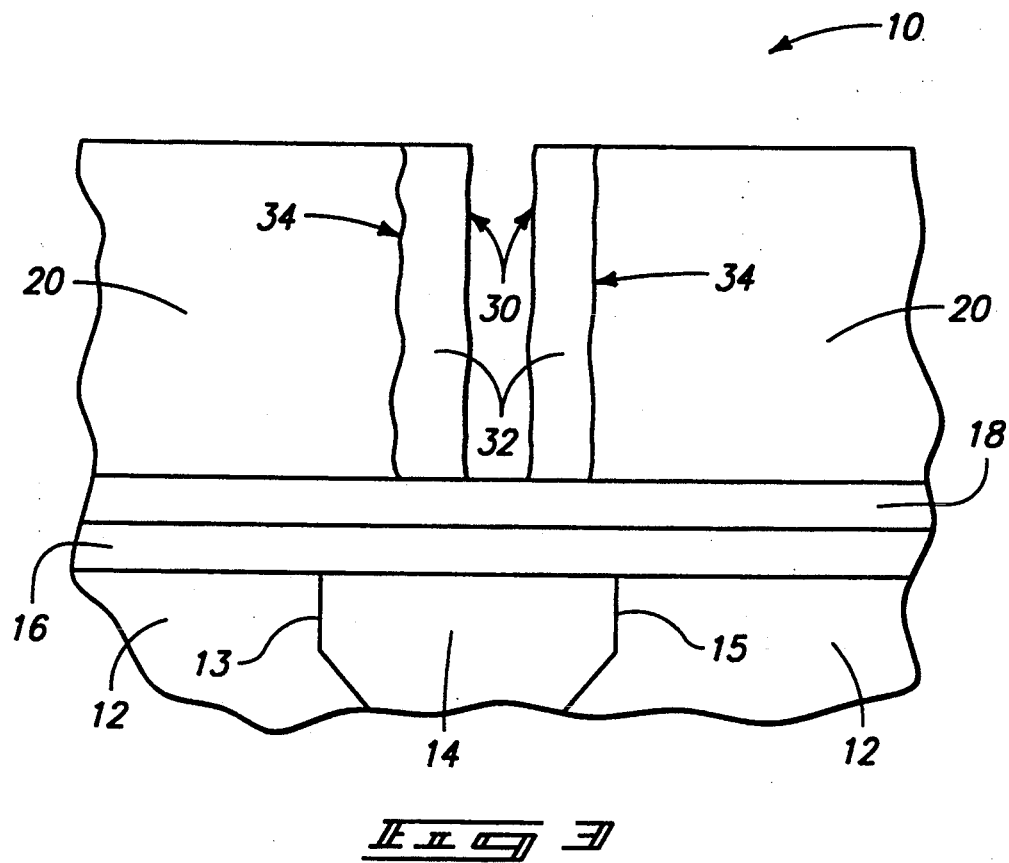
FIG. 3 is a view of the FIG. 1 wafer taken at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a stacked container capacitor comprising the following steps:

providing a substrate having a node to which electrical connection to a capacitor is to be made;

providing a layer of photoresist over the substrate and node;

patterning the photoresist to form a photoresist contact which overlaps within lateral confines of the node, the photoresist being patterned in a manner which produces inner photoresist contact sidewalls having standing wave ripples, the photoresist contact opening having an open width;

providing a layer of sacrificial material over the patterned photoresist and within the photoresist contact, the sacrificial layer being provided to a thickness which is less than one half the open width to less than completely fill the photoresist contact, the standing wave ripples first transferring to those regions of the sacrificial layer which overlap the photoresist contact inner sidewall standing wave ripples;

anisotropically etching the sacrificial material to produce a male molding ring having outer sidewalls possessing the first transferred standing wave ripples;

stripping the photoresist from the substrate;

providing a layer of electrically conductive material over and within the male molding ring, the first transferred standing wave ripples second transferring to those regions of the conductive layer which overlap the first transferred standing wave ripples;

anisotropically etching the conductive layer to outwardly expose upper portions of the male molding ring and to produce a capacitor container ring having inner sidewalls possessing the second transferred standing wave ripples, the capacitor container ring making electrical connection with the node;

stripping the male molding ring from the substrate;

providing a capacitor dielectric layer over the capacitor container rippled inner sidewalls; and providing an outer capacitor plate over the capacitor dielectric layer.

This and other aspects of the invention will be readily appreciated by the following description and concluding claims.

FIG. 1 shows a semiconductor wafer fragment in process for forming a stacked container capacitor, and is indicated generally with reference numeral 10. Such includes a substrate 12 having a node 14 to which electrical connection to a capacitor is to be made. In the simplified embodiment shown, substrate 12 would typically comprise an insulative oxide layer, such as borophosilicate glass, and storage node 14 would be in form of a conductive polysilicon plug. For purposes of the continuing discussion, node 14 is provided within lateral confines 13 and 15.

An etch stop layer 16 is provided over substrate 12 and storage node 14. An example thickness for layer 16 is 500 Angstroms, and a preferred material is $Si_3N_4$. A first conductive layer 18 is provided over etch stop layer 16. An example thickness for layer 18 is 500 Angstroms, with a preferred material being conductively doped polysilicon. A photoresist layer 20 is provided over conductive layer 18, etch stop layer 16 and the underlying substrate and node. Layer 20 is patterned as shown to form a photoresist contact 22 which overlaps within lateral confines 13 and 15 of node 14. Photoresist layer 20 is patterned in a manner which produces inner photoresist contact sidewalls 24 having standing wave ripples which are utilized to maximize capacitor container surface area as will be apparent subsequently. Processing parameters which impact formation of standing wave ripples include resist thickness, wavelength of light, reflectivity of the underlying layer and transparency of the resist. Standing wave ripples become more pronounced with thinner resist layers, short light wavelengths, more transparent photoresist and greater reflectivity of the underlying layer. A description of standing waves and their formation can be found in Wolf et al., "*Silicon Processing For The VLSI Era Volume 1*—Process Technology", pp. 438–439, Lattice Press 1986. Photoresist contact opening 22 has an average open width 26.

Referring to FIG. 2, a layer 28 of sacrificial material is provided over patterned photoresist layer 20 and within photoresist contact opening 22. Sacrificial layer 28 is provided to a thickness which is less than one-half open width 26 to less than completely fill photoresist contact 22. An example open contact width 26 would be 5000 Angstroms, while an example deposited thickness for layer 28 would be 1500 Angstroms. The standing wave ripples of photoresist contact sidewalls 24 first transfer to those regions of sacrificial layer 28 which overlap the photoresist contact inner sidewall standing wave ripples. The standing wave ripples also propagate, although typically to a lesser degree, to inner portions 30 of layer 28, as shown. An example and preferred material for layer 28 is $SiO_2$ deposited by decomposition of tetraethylorthosilicate (TEOS).

Referring to FIG. 3, sacrificial layer 28 is anisotropically etched to produce a male molding ring 32 having outer sidewalls 34 possessing the first transferred standing wave ripples. Standing wave ripples to a lesser degree are also present in the form of inner ring sidewalls 30. Such etching also outwardly exposes first conductive layer 18 within male-molding ring 32.

Figure 4:
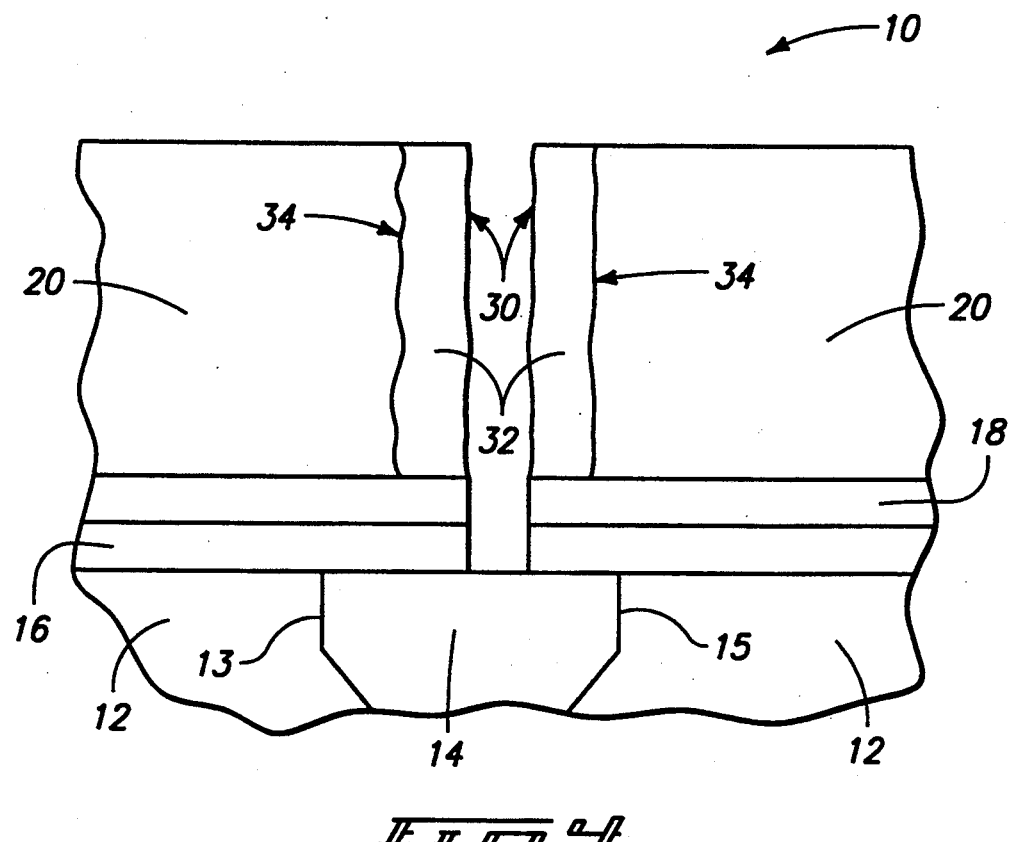
FIG. 4 is a view of the FIG. 1 wafer taken at a processing step subsequent to that shown by FIG. 3.
Figure 5:
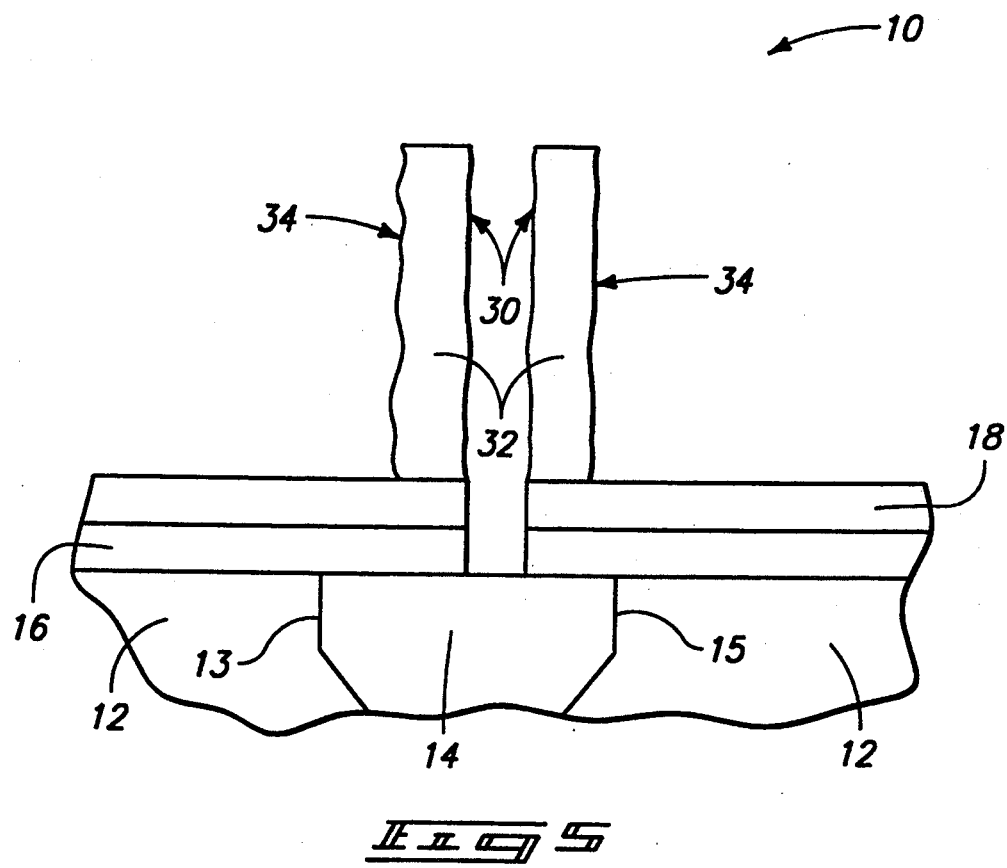
FIG. 5 is a view of the FIG. 1 wafer taken at a processing step subsequent to that shown by FIG. 4.
Figure 6:
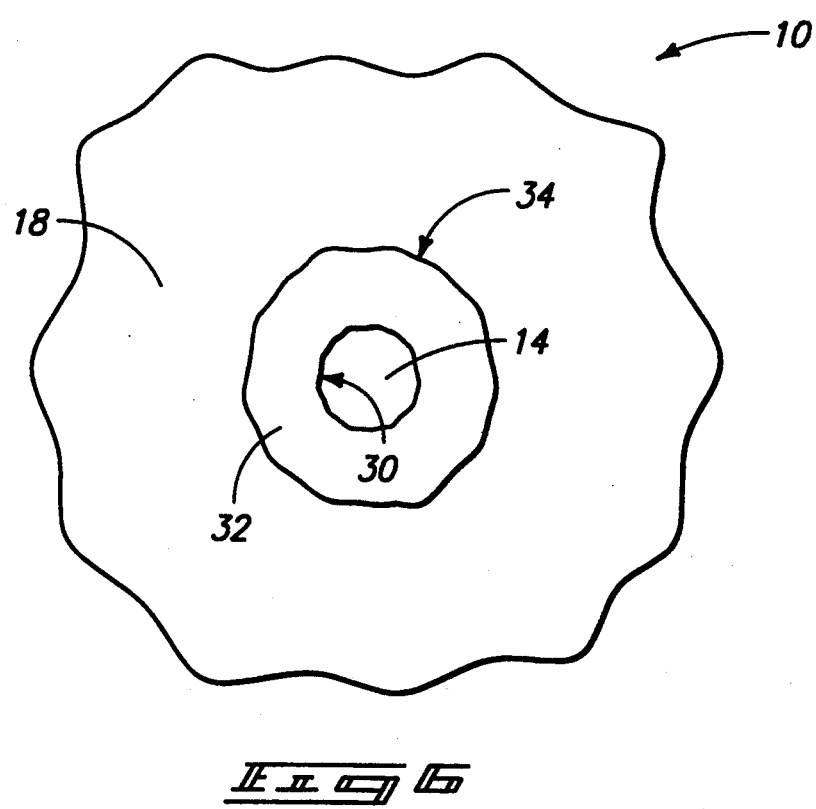
FIG. 6 is a top view of FIG. 5.
Figure 7:
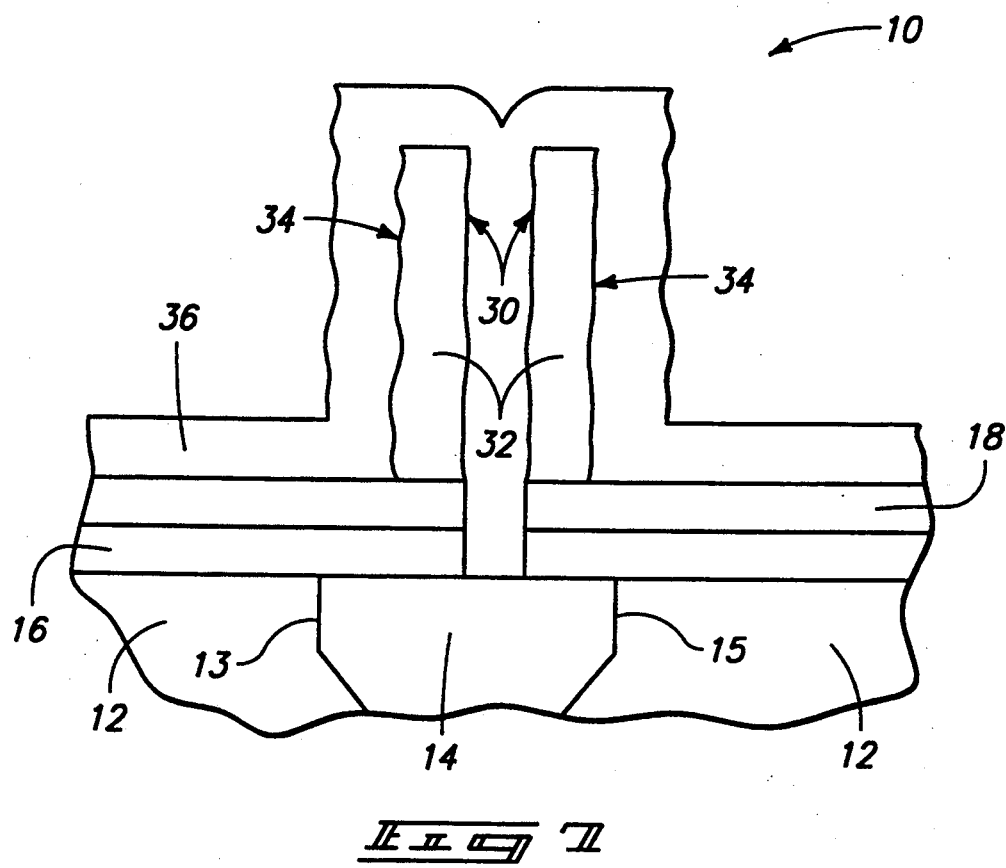
FIG. 7 is a view of the FIG. 1 wafer taken at a processing step subsequent to that shown by FIG. 5.

Referring to FIG. 4, respective selective etches are conducted to etch first conductive material layer 18 and underlying etch stop layer material 16 from within male-molding ring 32 to outwardly expose node 14. Where first conductive layer material 18 is polysilicon, the first etch preferably would be a dry etch utilizing a chlorine based chemistry. The subsequent selective etch of etch stop layer 16, where such comprises $Si_3N_4$, would preferably include dry chlorine chemistry. Referring to FIGS. 5 and 6, photoresist layer 20 is stripped from the substrate, leaving self-standing male molding ring 32. Referring to FIG. 7, a second layer 36 of electrically conductive material is provided over and within male molding ring 32. The first transferred standing wave ripples second transfer to those regions of second conductive layer 36 which overlap the first transferred standing wave ripples of sidewalls 34. Likewise and typically to a lesser extent, the standing wave ripples form on inner walls 30 transfer to second layer conductive material within ring 32. In the illustrated and preferred embodiment, second electrically conductive layer 36 is provided to completely fill the internal portion of male molding ring 32. An example and preferred thickness for layer 36 is 1000 Angstroms, with a preferred material being conductively doped polysilicon. Preferred deposition is conventional CVD.

Figure 8:
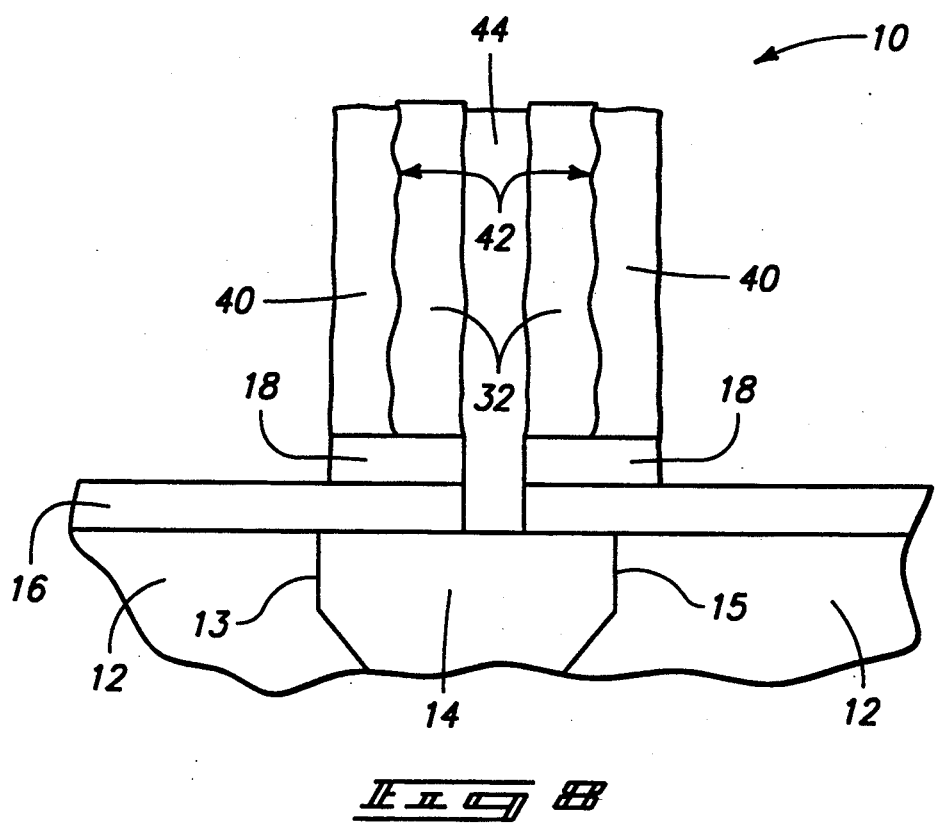
FIG. 8 is a view of the FIG. 1 wafer taken at a processing step subsequent to that shown by FIG. 7.

Referring to FIG. 8, second conductive layer 36 is anisotropically etched to outwardly expose upper portions of male molding ring 32 previously covered by layer 36, and to produce a capacitor container ring 40 having inner sidewalls 42 possessing the second transferred standing wave ripples. Such etching also produces a central polysilicon pillar 44 within formed capacitor container ring 40. Pillar 44 electrically connects, and in the illustrated and preferred embodiment physically contacts, with node 14 through etch stop layer 16. First conductive layer 18 is also etched to isolate it relative to the capacitor container construction and rest of the wafer. Capacitor container ring 40 makes electrical contact with node 14 solely through central pillar 44 via remaining portions of first conductive layer 18. Etch stop layer 16 facilitates the illustrated isolation etch of layer 18.

Figure 9:
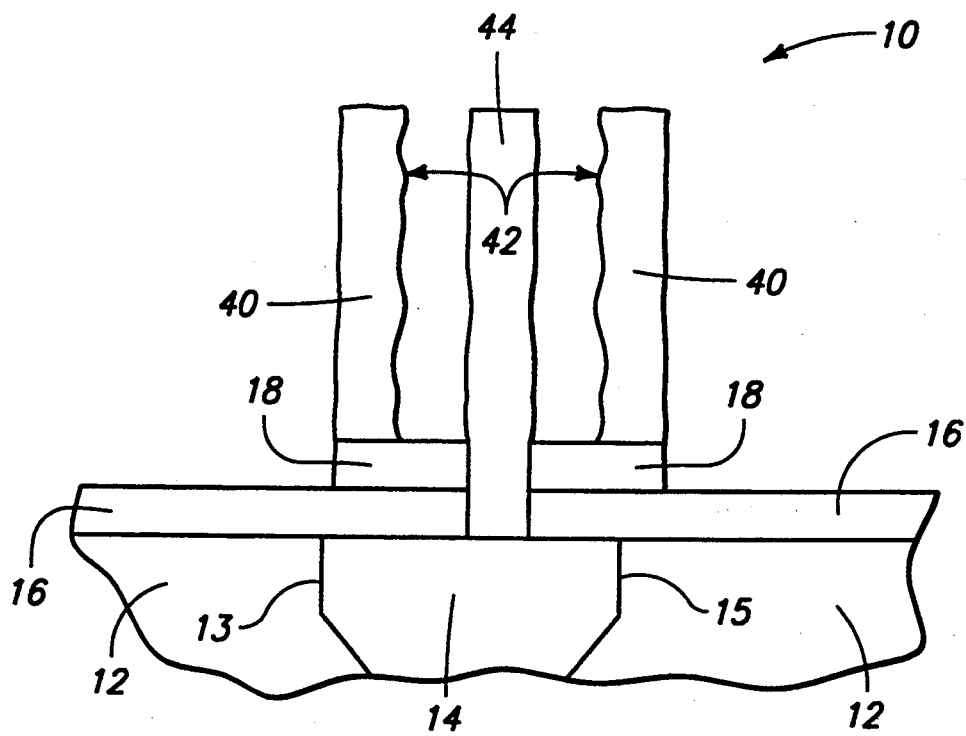
FIG. 9 is a view of the FIG. 1 wafer taken at a processing step subsequent to that shown by FIG. 8.
Figure 10:
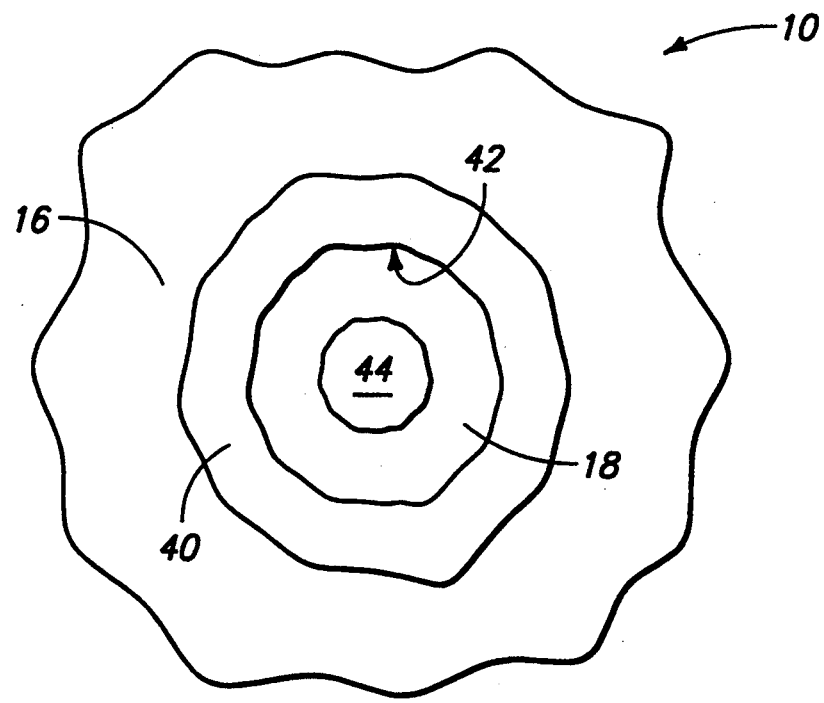
FIG. 10 is a top view of FIG. 9.

Referring to FIGS. 9 and 10, male molding ring 32 is stripped from the substrate. Where the male molding ring is $SiO_2$ and the conductive container constitutes polysilicon, the preferred stripping step would be a wet etch utilizing HF chemistry.

Referring to FIG. 11, a capacitor dielectric layer 46 (i.e., ONO) is provided over the capacitor container rippled inner sidewalls. Subsequently, an outer capacitor plate 48 (i.e., conductively doped polysilicon) is provided over capacitor dielectric layer 46.

The above-described embodiment has the significant processing advantage of producing rippled sidewalls which in essence maximize container surface area, and accordingly result in increased capacitance in a finished capacitor container construction.

Figure 13:
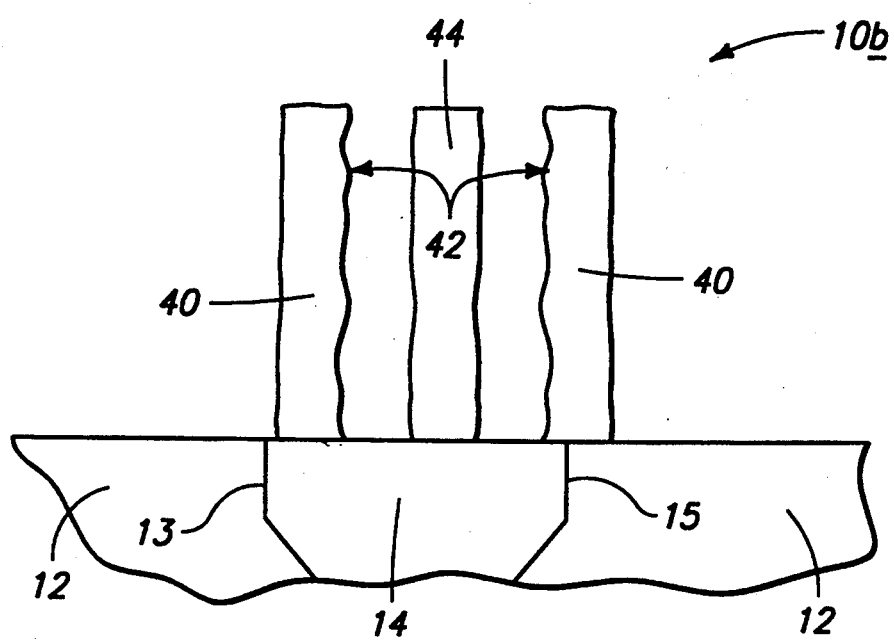
FIG. 13 is a diagrammatic fragmentary sectional view of another alternate embodiment semiconductor wafer fragment at another alternate processing step in accordance with the invention.

The above-described embodiment is the preferred embodiment, with the invention being limited only by the accompanying claims appropriately interpreted in accordance with the doctrine of equivalents. For example only, provision of first conductive layer 18 and etch stop layer 16 might be eliminated. FIG. 12 illustrates a construction whereby etch stop layer 16 was not provided. Such embodiment is indicated generally with reference number 10a. FIG. 13 illustrates an embodiment 10b whereby both the first conductive layer 18 and etch stop layer 16 were not provided. Such would perhaps require more close tolerance on the masking steps to assure good coverage of the container ring relative to the underlying node.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a stacked container capacitor comprising the following steps:

providing a substrate having a node to which electrical connection to a capacitor is to be made;

providing a layer of photoresist over the substrate and node;

patterning the photoresist to form a photoresist contact which overlaps within lateral confines of the node, the photoresist being patterned in a manner which produces inner photoresist contact sidewalls having standing wave ripples, the photoresist contact opening having an open width;

providing a layer of sacrificial material over the patterned photoresist and within the photoresist contact, the sacrificial layer being provided to a thickness which is less than one half the open width to less than completely fill the photoresist contact, the standing wave ripples first transferring to those regions of the sacrificial layer which overlap the photoresist contact inner sidewall standing wave ripples;

anisotropically etching the sacrificial material to produce a male molding ring having outer sidewalls possessing the first transferred standing wave ripples;

stripping the photoresist from the substrate;

providing a layer of electrically conductive material over and within the male molding ring, the first transferred standing wave ripples second transferring to those regions of the conductive layer which overlap the first transferred standing wave ripples;

anisotropically etching the conductive layer to outwardly expose upper portions of the male molding ring and to produce a capacitor container ring having inner sidewalls possessing the second transferred standing wave ripples, the capacitor container ring making electrical connection with the node;

stripping the male molding ring from the substrate;

providing a capacitor dielectric layer over the capacitor container rippled inner sidewalls; and providing an outer capacitor plate over the capacitor dielectric layer.

2. The semiconductor processing method of forming a stacked container capacitor of claim 1 wherein the electrically conductive layer is provided to completely fill the internal portion of the male molding ring, the step of anisotropically etching the conductive layer also producing a pillar within the formed capacitor container ring, the pillar electrically connecting with the node.

3. The semiconductor processing method of forming a stacked container capacitor of claim 1 wherein the electrically conductive layer is provided to completely fill the internal portion of the male molding ring, the step of anisotropically etching the conductive layer also producing a pillar within the formed capacitor container ring, the pillar physically contacting the node.

4. The semiconductor processing method of forming a stacked container capacitor of claim 1 wherein the electrically conductive layer is provided to completely fill the internal portion of the male molding ring, the step of anisotropically etching the conductive layer also producing a pillar within the formed capacitor container ring, the pillar electrically connecting with the node, the capacitor container ring making electrical contact with the node through the pillar.

5. The semiconductor processing method of forming a stacked container capacitor of claim 1 wherein the sacrificial material comprises silicon dioxide.

6. The semiconductor processing method of forming a stacked container capacitor of claim 1 wherein the conductive layer comprises conductively doped polysilicon.

7. The semiconductor processing method of forming a stacked container capacitor of claim 1 wherein the sacrificial material comprises silicon dioxide, and the conductive layer comprises conductively doped polysilicon.

8. A semiconductor processing method of forming a stacked container capacitor comprising the following steps:

providing a substrate having a node to which electrical connection to a capacitor is to be made;

providing a first conductive layer over the substrate and node;

providing a layer of photoresist over the first conductive layer;

patterning the photoresist to form a photoresist contact which overlaps within lateral confines of the node, the photoresist being patterned in a manner which produces inner photoresist contact sidewalls having standing wave ripples, the photoresist contact opening having an open width;

providing a layer of sacrificial material over the patterned photoresist and within the photoresist contact, the sacrificial layer being provided to a thickness which is less than one half the open width to less than completely fill the photoresist contact, the standing wave ripples first transferring to those regions of the sacrificial layer which overlap the photoresist contact inner sidewall standing wave ripples;

anisotropically etching the sacrificial material to produce a male molding ring having outer sidewalls possessing the first transferred standing wave ripples, the underlying first conductive layer being outwardly exposed within the male molding ring;

stripping the photoresist from the substrate;

providing a second layer of electrically conductive material over and within the male molding ring, the first transferred standing wave ripples second transferring to those regions of the second conductive layer which overlap the first transferred standing wave ripples, the second layer of conductive material electrically connecting with the node;

anisotropically etching the second conductive layer,
a) to outwardly expose upper portions of the male molding ring, b) to produce a capacitor container ring having inner sidewalls possessing the second transferred standing wave ripples, and c) etching the first conductive layer; the capacitor container ring making electrical connection with the node through the first conductive layer;

stripping the male molding ring from the substrate;

providing a capacitor dielectric layer over the capacitor container rippled inner sidewalls; and providing an outer capacitor plate over the capacitor dielectric layer.

9. The semiconductor processing method of forming a stacked container capacitor of claim 8 wherein the second electrically conductive layer is provided to completely fill the internal portion of the male molding ring, the step of anisotropically etching the second conductive layer also producing a pillar within the formed capacitor container ring, the pillar electrically connecting with the node.

10. The semiconductor processing method of forming a stacked container capacitor of claim 8 wherein the second electrically conductive layer is provided to completely fill the internal portion of the male molding ring, the step of anisotropically etching the second conductive layer also producing a pillar within the formed capacitor container ring, the pillar physically contacting the node.

11. The semiconductor processing method of forming a stacked container capacitor of claim 8 wherein the second electrically conductive layer is provided to completely fill the internal portion of the male molding ring, the step of anisotropically etching the second conductive layer also producing a pillar within the formed capacitor container ring, the pillar electrically connecting with the node, the capacitor container ring making electrical contact with the node through the pillar.

12. The semiconductor processing method of forming a stacked container capacitor of claim 8 wherein the sacrificial material comprises silicon dioxide.

13. The semiconductor processing method of forming a stacked container capacitor of claim 8 wherein the first conductive layer comprises conductively doped polysilicon.

14. The semiconductor processing method of forming a stacked container capacitor of claim 8 wherein the second conductive layer comprises conductively doped polysilicon.

15. The semiconductor processing method of forming a stacked container capacitor of claim 8 wherein the first conductive layer comprises conductively doped polysilicon, and the second conductive layer comprises conductively doped polysilicon.

16. The semiconductor processing method of forming a stacked container capacitor of claim 8 wherein the sacrificial material comprises silicon dioxide, the first conductive layer comprises conductively doped polysilicon, and the second conductive layer comprises conductively doped polysilicon.

17. A semiconductor processing method of forming a stacked container capacitor comprising the following steps:
   providing a substrate having a node to which electrical connection to a capacitor is to be made;
   providing an etch stop layer over the substrate and node;
   providing a first conductive layer over the etch stop layer;
   providing a layer of photoresist over the first conductive layer;
   patterning the photoresist to form a photoresist contact which overlaps within lateral confines of the node, the photoresist being patterned in a manner which produces inner photoresist contact sidewalls having standing wave ripples, the photoresist contact opening having an open width;
   providing a layer of sacrificial material over the patterned photoresist and within the photoresist contact, the sacrificial layer being provided to a thickness which is less than one half the open width to less than completely fill the photoresist contact, the standing wave ripples first transferring to those regions of the sacrificial layer which overlap the photoresist contact inner sidewall standing wave ripples;
   anisotropically etching the sacrificial material to produce a male molding ring having outer sidewalls possessing the first transferred standing wave ripples, the underlying first conductive layer being outwardly exposed within the male molding ring;
   etching the first conductive material layer and underlying etch stop layer material from within the male molding ring to outwardly expose the node;
   stripping the photoresist from the substrate;
   providing a second layer of electrically conductive material over and within the male molding ring, the first transferred standing wave ripples second transferring to those regions of the second conductive layer which overlap the first transferred standing wave ripples, the second layer of conductive material electrically connecting with the node;
   anisotropically etching the second conductive layer, a) to outwardly expose upper portions of the male molding ring, b) to produce a capacitor container ring having inner sidewalls possessing the second transferred standing wave ripples, and c) etching the first conductive layer using the etch stop layer as an etch stop; the capacitor container ring making electrical connection with the node through the first conductive layer;
   stripping the male molding ring from the substrate;
   providing a capacitor dielectric layer over the capacitor container rippled inner sidewalls; and
   providing an outer capacitor plate over the capacitor dielectric layer.

18. The semiconductor processing method of forming a stacked container capacitor of claim 17 wherein the second electrically conductive layer is provided to completely fill the internal portion of the male molding ring, the step of anisotropically etching the second conductive layer also producing a pillar within the formed capacitor container ring, the pillar electrically connecting with the node.

19. The semiconductor processing method of forming a stacked container capacitor of claim 17 wherein the second electrically conductive layer is provided to completely fill the internal portion of the male molding ring, the step of anisotropically etching the second conductive layer also producing a pillar within the formed capacitor container ring, the pillar physically contacting the node through the etch stop layer.

20. The semiconductor processing method of forming a stacked container capacitor of claim 17 wherein the second electrically conductive layer is provided to completely fill the internal portion of the male molding ring, the step of anisotropically etching the second conductive layer also producing a pillar within the formed capacitor container ring, the pillar electrically connecting with the node, the capacitor container ring making electrical contact with the node through the pillar.

21. The semiconductor processing method of forming a stacked container capacitor of claim 17 wherein the sacrificial material comprises silicon dioxide.

22. The semiconductor processing method of forming a stacked container capacitor of claim 17 wherein the first conductive layer comprises conductively doped polysilicon.

23. The semiconductor processing method of forming a stacked container capacitor of claim 17 wherein the second conductive layer comprises conductively doped polysilicon.

24. The semiconductor processing method of forming a stacked container capacitor of claim 17 wherein the first conductive layer comprises conductively doped polysilicon, and the second conductive layer comprises conductively doped polysilicon.

25. The semiconductor processing method of forming a stacked container capacitor of claim 17 wherein the sacrificial material comprises silicon dioxide, the first conductive layer comprises conductively doped polysilicon, and the second conductive layer comprises conductively doped polysilicon.

* * * * *